(12) United States Patent
Jung

(10) Patent No.: US 8,683,643 B2
(45) Date of Patent: Apr. 1, 2014

(54) STOCKER

(75) Inventor: Ki-Chae Jung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 234 days.

(21) Appl. No.: 12/855,910

(22) Filed: Aug. 13, 2010

(65) Prior Publication Data

US 2011/0035897 A1    Feb. 17, 2011

(30) Foreign Application Priority Data

Aug. 13, 2009    (KR) .................. 10-2009-0074900

(51) Int. Cl.
*A47L 5/36*    (2006.01)

(52) U.S. Cl.
USPC ........................................... 15/301

(58) Field of Classification Search
USPC ..................... 15/301, 319, 339; 700/218
See application file for complete search history.

(56) References Cited

U.S. PATENT DOCUMENTS

| 5,525,106 A | 6/1996 | Iizuka et al. |
| 2007/0119016 A1 * | 5/2007 | Drevitson et al. ............... 15/339 |

FOREIGN PATENT DOCUMENTS

| CN | 1638033 A | 7/2005 |
|---|---|---|
| JP | 62-19188 U | 2/1987 |
| JP | 62241693 | 10/1987 |
| JP | 0359189 | 6/1991 |
| JP | 04272027 | 9/1992 |
| JP | 058943 | 2/1993 |
| JP | 07263325 | 10/1995 |
| JP | 09-064144 | 3/1997 |
| JP | 11233584 | 8/1999 |
| JP | 2003077987 | 3/2003 |
| JP | 2007025436 | 2/2007 |
| JP | 2007067303 | 3/2007 |
| JP | 2007-242702 A | 9/2007 |
| JP | 2008-277480 A | 11/2008 |
| KR | 10-2006-0122287 A | 11/2006 |
| KR | 10-0720311 B1 | 5/2007 |
| KR | 1020070084872 A | 8/2007 |
| KR | 10-2008-0001010 A | 1/2008 |
| KR | 100819114 B1 | 3/2008 |
| KR | 10-2008-0081692 A | 9/2008 |
| KR | 10-2008-0094287 A | 10/2008 |

OTHER PUBLICATIONS

Search Report.
EP search report dated Nov. 21, 2013 of the corresponding EP Patent appliciation No. 10172811.1.

* cited by examiner

*Primary Examiner* — Robert Scruggs
(74) *Attorney, Agent, or Firm* — Robert E. Bushnell, Esq.

(57) ABSTRACT

A stocker including a main body unit having a plurality of receiving shelves, a transfer unit transferring a received material to be moved to the main body unit, a robot arm stacking the received material transferred by the transfer unit on one of the receiving shelves of the main body unit, and a dirt collecting unit moving in conjunction with the robot arm to remove particles from inside the main body unit.

6 Claims, 3 Drawing Sheets

STOCKER

CROSS-REFERENCE TO RELATED APPLICATION

This application claims the benefit of Korean Patent Application No. 10-2009-0074900, filed Aug. 13, 2009, in the Korean Intellectual Property Office, the disclosure of which is incorporated herein by reference.

BACKGROUND

1. Field

Aspects of the present invention relate to a stocker. More particularly, it relates to a stocker receiving various substrates.

2. Description of the Related Art

A stocker temporarily holds or stores various substrates used in a display panel manufacturing process. The display panel manufacturing process requires high precision, and a defect easily occurs in display panels because of microparticles. Accordingly, an internal space of the stocker should be maintained to be clean. Particularly, a shelf of the stocker directly contacts the substrates, and therefore particles on the shelf can easily move to the substrates.

As a general method for maintaining the inside of the stocker to be clean, a person directly enters into the stocker for cleaning. However, particles may be carried inside the stocker together with the person who enters therein, and operation of the stocker must be suspended while the stocker is being cleaned.

The above information disclosed in this Background section is only for enhancement of understanding of the background of the invention and therefore it may contain information that does not form the prior art that is already known in this country to a person of ordinary skill in the art.

SUMMARY

Aspects of the present invention have been made in an effort to provide a stocker having an advantage of effectively maintaining the internal environment thereof to be clean.

Aspects of the present invention provide a stocker including a main body unit having a plurality of receiving shelves, a transfer unit transferring a received material to be moved to the main body unit, a robot arm stacking the received material transferred by the transfer unit on one of the receiving shelves of the main body unit, and a dirt collecting unit moving in conjunction with the robot arm to remove particles from inside the main body unit.

According to an aspect of the invention, the dirt collecting unit may include a dirt collecting duct moving in conjunction with the robot arm, and a vacuum pump disposed on the transfer unit to evacuate internal air of the main body unit through the dirt collecting duct.

According to an aspect of the invention, the robot arm may move the received material through one end portion of the robot arm, and the dirt collecting duct may have a first opening formed at the one end portion of the robot arm and a second opening connected to the vacuum pump.

According to an aspect of the invention, the dirt collecting unit may further include a purification filter disposed between the dirt collecting duct and the vacuum pump.

According to an aspect of the invention, the stocker may include a cleaning pad having a base substrate and an absorbing unit formed at an edge of the base substrate, wherein the cleaning pad is stacked on the main body unit so that the absorbing unit contacts another one of the receiving shelves of the main body unit.

According to another aspect of the present invention there is provided a stocker having a main body unit, the stocker including a robot arm stacking a received material in the main body unit and a dirt collecting unit to remove particles from inside the main body unit, wherein the dirt collecting unit moves in conjunction with the robot arm.

According to yet another aspect of the present invention, there is provided a dirt collecting unit of a stocker having a robot arm, the dirt collecting unit having a dirt collecting duct disposed on the robot arm; a vacuum pump disposed at a first end of the robot arm, and a purification filter disposed between the dirt collecting duct and the vacuum pump.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
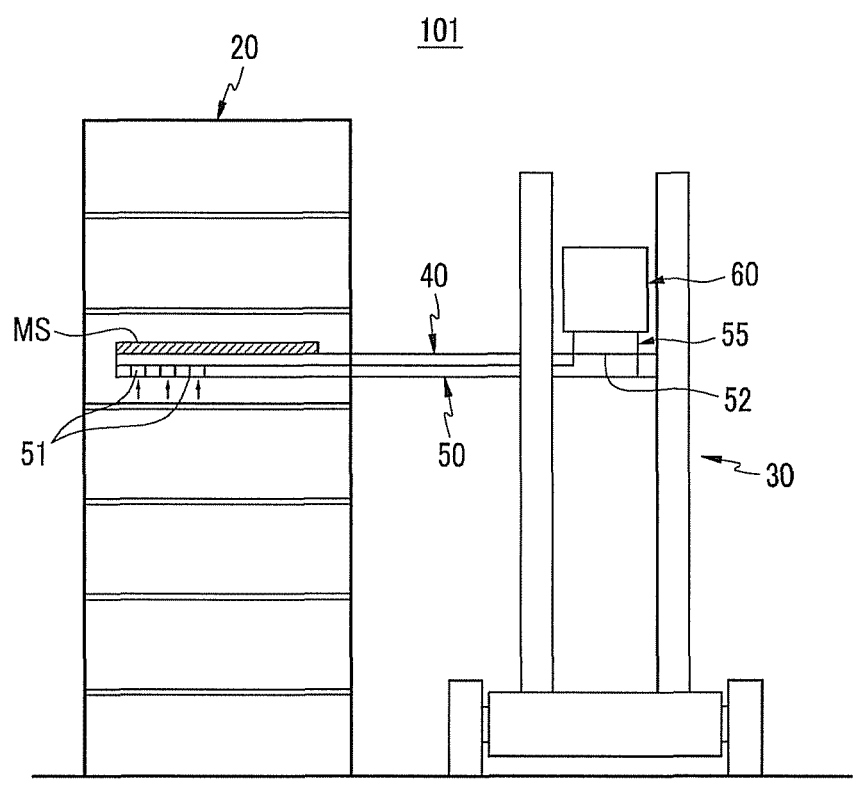
FIG. 1 is a schematic diagram of a stocker according to a first exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Furthermore, with exemplary embodiments of the present invention, detailed description is given for the constituent elements in the first exemplary embodiment with reference to the relevant drawings by using the same reference numerals for the same constituent elements, while only different constituent elements from those related to the first exemplary embodiment are described in other exemplary embodiments.

Parts that are irrelevant to the description are omitted in order to clearly describe the present invention, and like reference numerals designate like elements throughout the specification.

Furthermore, as the size and thickness of the respective structural components shown in the drawings are arbitrarily illustrated for explanatory convenience, the present invention is not necessarily limited to the illustrations provided.

In the drawings, the thickness of layers, films, panels, regions, etc., are exaggerated for clarity and explanatory convenience. It will be understood that when an element such as a layer, film, region, or substrate is referred to as being "on" or "formed on" another element, it can be directly on the other element or intervening elements may also be present. In contrast, when an element is referred to as being "directly on" or "formed directly on" another element, there are no intervening elements present.

Hereinafter, a stocker 101 according to a first exemplary embodiment of the present invention will be described with reference to FIG. 1 and FIG. 2.

Figure 2:
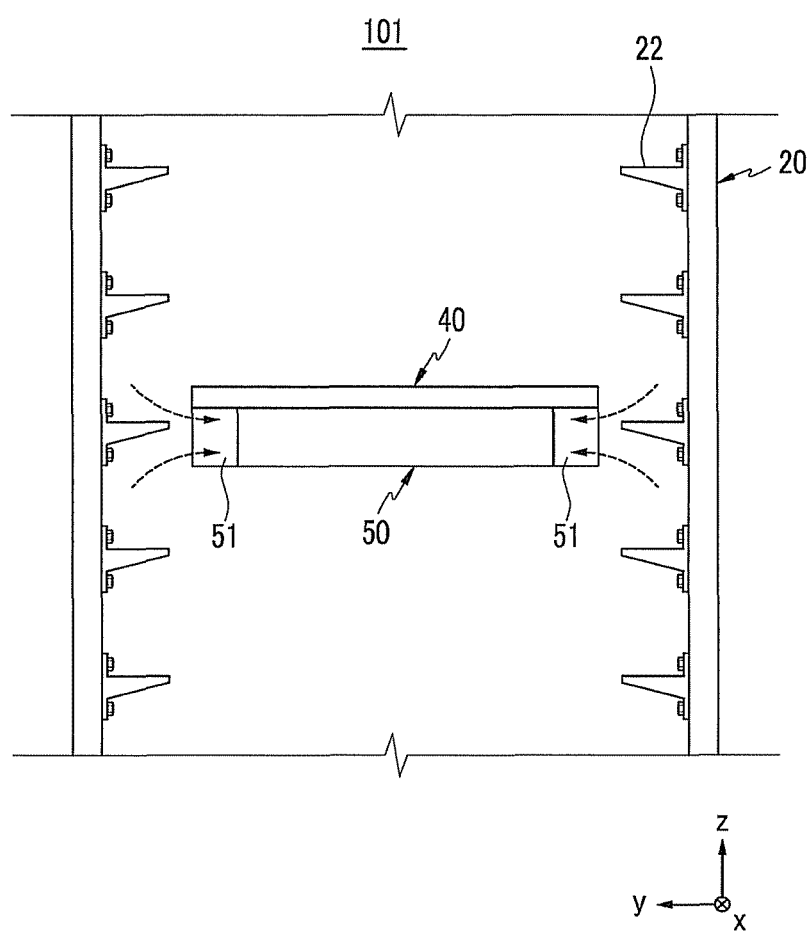
FIG. 2 is an enlarged schematic diagram of an internal structure of a main body portion of FIG. 1.

Referring to FIG. 1 and FIG. 2, the stocker 101 includes a main body unit 20, a transfer unit 30, a robot arm 40, and a dirt collecting unit having a dirt collecting duct 50, a purification filter 55, and a vacuum pump 60.

The main body unit 20 includes a plurality of receiving shelves each for a received material MS. Here, the received material MS may be various substrates used in a display panel manufacturing process.

The transfer unit 30 moves the received material MS from the outside to the front of the main body unit 20 for transportation. In further detail, the transfer unit 30 can move a received material MS by using a roller formed in a lower portion thereof, and can move the received material MS up and down through a lifter formed with the roller. However, a structure of the transfer unit 30 is not limited to the above-described structure. That is, the structure of the transfer unit 30 for transferring the received material MS may be variously modified within a range that can be easily realized by a person skilled in the art.

The robot arm 40 stacks the received material MS transferred in front of the main body unit 20 by the transfer unit 30 on the receiving shelf 22 of the main body unit 20. The robot arm 40 may move the received material MS stacked on the receiving shelf 22 back to the transfer unit 30. In this case, the robot arm 40 uses one end portion thereof for moving the received material MS.

The dirt collecting unit includes a dirt collecting duct 50, a vacuum pump 60, and a purification filter 55. The dirt collecting duct 50 moves with the robot arm 40. That is, the dirt collecting duct 50 is integrally formed with the robot arm 40, or is closely attached to the robot arm 40 and moves along with the robot arm 40. Here, the dirt collecting duct 50 has a first opening 51 disposed at one end portion of the robot arm 40 that moves the received material MS, and a second opening 52 connected to the vacuum pump 60.

The vacuum pump 60 is connected with the second opening 52 of the dirt collecting duct 50 to evacuate internal air of the main body unit 20 through the first opening 51 of the dirt collecting duct 50. As described, when the vacuum pump 60 evacuates the air, particles inside the main body unit 20 are also evacuated and then eliminated.

The purification filter 55 is disposed between the dirt collecting duct 50 and the vacuum pump 60 to filter particles evacuated through the dirt collecting duct 50.

An operation effect of the stocker 101 according to the first exemplary embodiment of the present invention will now be described in further detail.

The dirt collecting duct 50 moves with the robot arm 40. Accordingly, the particles inside the main body unit 20 can be effectively eliminated through the dirt collecting duct 50 by moving the robot arm 40 all over after temporarily suspending stacking of received materials MS.

Accordingly, particles concentrated in a part thereof can be effectively eliminated. Particularly, the receiving shelf 22 is a part that directly contacts the received material MS and therefore the particles on the receiving shelf 22 can be easily moved to a received material MS placed thereon. However, the first opening 51 of the dirt collecting duct 50 that evacuates particles with air is located at one end portion of the robot arm 40 that stacks the received material MS on the receiving shelf 22 of the main body unit 20, and thus particles around the receiving shelf 22 can be effectively eliminated.

Further, the particles inside the main body unit 20 can be eliminated through the dirt collecting duct 50 while simultaneously stacking the receiving material MS on the receiving shelf 22 of the main body unit 22 by moving the robot arm 40 without temporarily suspending the stacking of the received material MS.

With such a configuration, the stocker 101 can maintain the internal environment of the main body unit 20 that receives the receiving material MS by effectively eliminating particles therein.

Hereinafter, a second exemplary embodiment of the present invention will be described with reference to FIG. 1 and FIG. 3.

Figure 3:
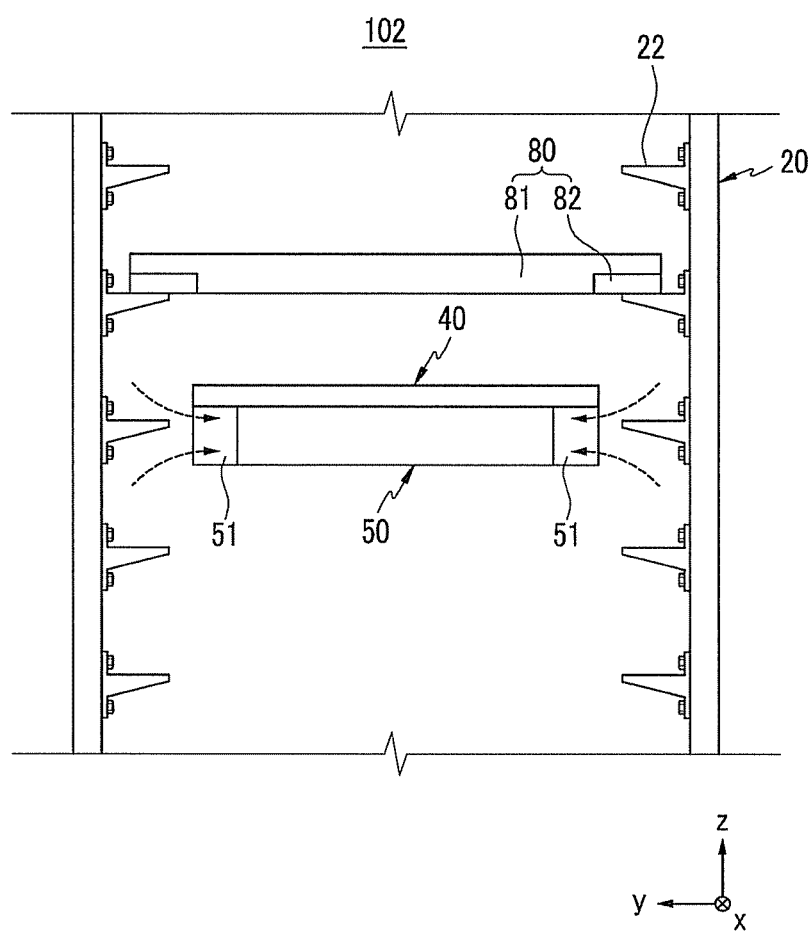
FIG. 3 is a schematic diagram of a stocker according to a second exemplary embodiment of the present invention.

As shown in FIG. 1 and FIG. 3, a stocker 102, according to a second exemplary embodiment of the present invention, further includes a cleaning pad 80. The cleaning pad 80 includes a base substrate 81 and an absorbing unit 82 formed at an edge of the base substrate 81.

Like a received material MS, the cleaning pad 80 is moved by a robot arm 40. The cleaning pad 80 is stacked in a main body unit 22 such that the absorbing unit 82 contacts a receiving shelf 22 of the main body unit 20. Thus, the absorbing unit 82 of the cleaning pad 80 can eliminate particles that are not eliminated by a dirt collecting unit having a dirt collecting duct 50, a purification filter 55, and a vacuum pump 60, and thus remain on the receiving shelf 22 by absorbing them. That is, the cleaning pad 80 eliminates the particles that are strongly attached on the receiving shelf 22 and cannot be eliminated by the dirt collecting duct 50, the purification filter 55, and the vacuum pump 60 so as to prevent the particles from being moved to the receiving material MS and contaminating it.

In addition, at the same time that the robot arm 40 places the cleaning pad 80 on the receiving shelf 22, the air is evacuated through the dirt collecting duct 50 so that the particles inside the main body unit 20 can be eliminated.

In further detail, the stocker 102 according to the second exemplary embodiment of the present invention sequentially puts down the cleaning pad 80 on the respective receiving shelf 22 and lifts the same. Simultaneously, particles inside the main body unit 20 are evacuated through the dirt collecting duct 50 and then eliminated. Through the above process, particles that cannot be eliminated by the dirt collecting duct 50, the purification filter 55, and the vacuum pump 60 can be eliminated.

Once the particles attached to the receiving shelves 22 are sufficiently eliminated through the cleaning pad 80, the robot arm 40 moves the cleaning pad 80 out from the main body unit 20 and stacks the received material MS on the receiving shelf 22. During stacking of the received material MS, particles inside the main body unit 20 can be continuously eliminated.

With the above-described configuration, the stocker 102 further effectively eliminates particles inside the main body unit 20 where a received material (MS) is received to thereby maintain a clean internal environment of the main body unit 20.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A stocker comprising:
a main body unit having a plurality of receiving shelves;
a transfer unit transferring a received material to be moved to the main body unit;

a robot arm stacking the received material transferred by the transfer unit on one of the receiving shelves of the main body unit;

a dirt collecting unit moving in conjunction with the robot arm to remove particles from inside the main body unit from a first receiving shelve of the plurality of receiving shelves, said dirt collecting unit having a dirt collecting duct contained entirely within the robot arm or entirely attached directly to the robot arm that moves in conjunction with the robot arm; and a cleaning pad having a base substrate and an absorbing unit formed at an underside edge of the base substrate, said cleaning pad is stacked on the main body unit so that the absorbing unit contacts an upper side surface of a second shelve of the plurality receiving shelves of the main body unit, wherein dirt is simultaneously removed from the first and second shelves, said first and second shelves are different and separate shelves.

2. The stocker of claim 1, wherein the dirt collecting unit comprises:

a vacuum pump disposed on the transfer unit to evacuate internal air of the main body unit through the dirt collecting duct.

3. The stocker of claim 2, wherein the robot arm moves the received material through one end portion of the robot arm, and the dirt collecting duct has a first opening formed at the one end portion of the robot arm and a second opening connected to the vacuum pump.

4. The stocker of claim 2, wherein the dirt collecting unit further comprises a purification filter disposed between the dirt collecting duct and the vacuum pump.

5. The stocker of claim 1, wherein the dirt collecting unit comprises:

a dirt collecting duct providing a pathway to move particles from inside the main body unit to outside the main body unit; and a vacuum pump to evacuate air from inside the main body unit to outside the main body unit via the dirt collecting duct.

6. A dirt collecting unit of a stocker having a robot arm, the dirt collecting unit comprising:

a vacuum pump disposed at a first end of the robot arm;

a dirt collecting duct contained entirely within the robot arm or entirely attached directly to the robot arm that moves in conjunction with the robot arm, said dirt collecting duct extending from the first end of the robot arm to a second end of the robot arm and removes dirt from a first shelve; and a cleaning pad having a base substrate and an absorbing unit formed at an underside edge of the base substrate, said cleaning pad is stacked on the robot arm so that the absorbing unit contacts an upper side surface of a second shelve, wherein dirt is simultaneously removed from the first and second shelves, said first and second shelves are different and separate shelves, wherein the first end of the robot arm is at an end opposite from the second end of the robot arm.

* * * * *